(12) United States Patent
Chang

(10) Patent No.: US 6,754,079 B1
(45) Date of Patent: Jun. 22, 2004

(54) KD HEAT SINK FINS

(76) Inventor: Hung-Chun Chang, No. 461, Jungjeng Rd., Fugang Li, Yangmei Jen, Taoyuang (TW)

(*) Notice: Subject to any disclaimer, the term of this patent is extended or adjusted under 35 U.S.C. 154(b) by 0 days.

(21) Appl. No.: 10/418,145

(22) Filed: Apr. 18, 2003

(51) Int. Cl.⁷ .................................................. H05K 7/20
(52) U.S. Cl. ........................ 361/709; 361/704; 257/722; 165/80.3; 165/185
(58) Field of Search ................................ 361/690, 695, 361/704, 709, 710; 257/722; 174/16.1, 16.3; 165/80.3, 185

(56) References Cited

U.S. PATENT DOCUMENTS

| | | | | |
|---|---|---|---|---|
| 5,558,155 A | * | 9/1996 | Ito ............................ 165/80.3 |
| 6,104,609 A | * | 8/2000 | Chen .......................... 361/695 |
| 6,336,498 B1 | * | 1/2002 | Wei ............................ 165/80.3 |
| 6,340,056 B1 | * | 1/2002 | Huang et al. ............... 165/185 |
| 6,386,275 B1 | * | 5/2002 | Kuo et al. .................. 165/80.3 |
| 6,449,160 B1 | * | 9/2002 | Tsai ........................... 361/709 |
| 6,474,407 B1 | * | 11/2002 | Chang et al. .............. 165/80.3 |
| 6,607,023 B2 | * | 8/2003 | Ho et al. ...................... 165/78 |
| 6,607,028 B1 | * | 8/2003 | Wang et al. ................ 165/185 |
| 6,639,802 B1 | * | 10/2003 | Dong et al. ................ 361/709 |

* cited by examiner

Primary Examiner—Boris Chervinsky
(74) Attorney, Agent, or Firm—Troxell Law Office PLLC

(57) ABSTRACT

A knock down heat sink, and more particularly, to one that comprised of multiple fins overlapped among one another into a stack and a specific spacing is defined between any two abutted fins to provide good heat dispersion and form a reliable heat sink allowing extension as desired for production cost reduction, increased production capability and easier assembly.

3 Claims, 5 Drawing Sheets

KD HEAT SINK FINS

BACKGROUND OF THE INVENTION (a) Field of the Invention

The present invention is related to a knock down heat sink, and more particularly, to one comprised of multiple fins overlapped among one another with a specific spacing defined between any two abutted fins that allows reduced production cost, increased production capability and easier assembly.

(b) Description of the Prior Art

Whereas most of the heat sinks generally available in the market are made by cast or extruded aluminum alloy in one piece containing multiple fins arranged with a proper spacing among one another to disperse the heat by the area of each fin, the specific dimension of the integrated configuration and the limited numbers of the fins of the prior limit the range of application and heat dispersion efficiency. Therefore, improved structure of a KD heat sink has been introduced. The KD heat sink is comprised of multiple metal fins overlapped on one another in a stack in the hope to increase the number of the fin and the heat dispersion area. Since all the fins are stacked up practically leaving no spacing between any two abutted fins, resulting in insufficient space for heat dispersion.

Furthermore, the KD heat sink of the prior art needs a frame for the assembly of the fins. Wherein,multiple insertion boards are erected on the frame, and multiple troughs are provided on each fin for the fin to be inserted into the insertion boards, and in turn for the insertion boards to hold those fins in position. Finally a locking plate is placed on the most top fin and locks those insertion boards thus to hold all those fins in steady. The assembly process is complicate since too many members are involved. In addition, each member requires the development of individual molds, resulting in higher production cost. Above all, the height of the KD heat sink is limited by the existing height limit of the insertion board making the KD heat sink less variable.

SUMMARY OF THE INVENTION

The primary purpose of the present invention is to provide an improved structure for heat sink fins that allows specific spacing be provided for good heat dispersion and the number of the fins can be extended as desired. To achieve the purpose, both longer sides of the fin are respectively provided with a sidewall; multiple locking members are provided relatively on both sidewalls; each locking member comprised of two chucks extending upward with tips slightly curved inwardly to face each other to define a first attachment edge and a second attachment edge Another purpose of the present invention is to provide an improved structure for heat sink fins that each fin is made in one piece. To achieve the purpose,

DETAILED DESCRIPTION OF THE PREFERRED EMBODIMENTS

Figure 1:
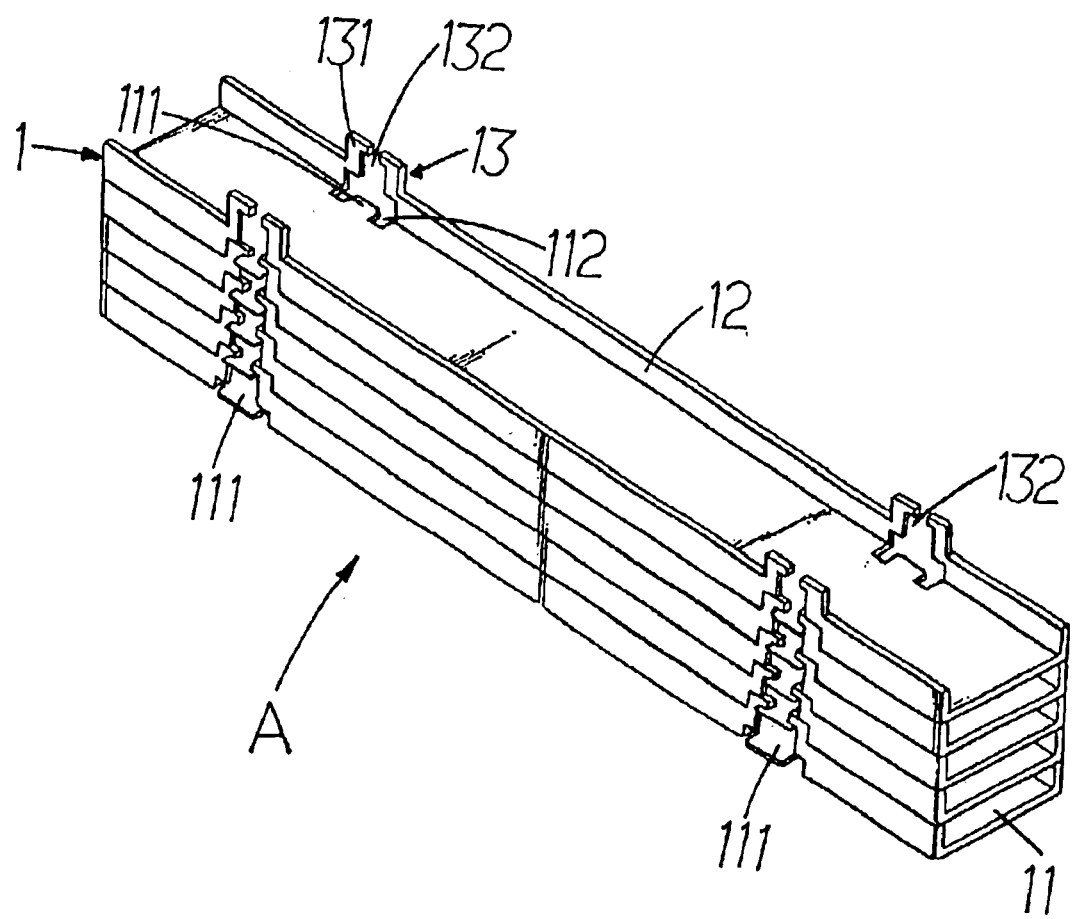
FIG. 1 is a perspective view of a preferred embodiment of the present invention.

Referring to FIG. 1, a heat sink (A) is comprised of multiple fins (1) overlapped on one another. Wherein, each of those fins (1) is provided with a base plate (11), a sidewall (12) is each provided on both of the longer sides of the fin (1), and multiple locking members (13) are provided on both longer sides of the fin (1). Those multiple locking members (13) on one side are provided at where relatively to those on the other side of the base plate (11). Also referring to FIG. 2, each base plate (11) is directly punched in one-piece configuration. Each locking member (13) has two teeth (131) extending upward from the sidewall (12) and curved inwardly at the tip facing each other. The extended part of each tooth (131) defines a primary locking edge (1311) provided with elongation and the curved part of each tooth (131), a secondary locking edge (1312). The primary and the secondary locking edges (1311, 1312) define a locking gap (132); and both of secondary locking edges (1312), a window (133). A latch (111) is provided to the locking gap (132) at where in relation to its bottom. A recess (112) is each provided on both sides of the latch (111). The width of the latch (111) is slightly greater than the spacing between both of the primary locking edges (1311) and slightly smaller than that of the window (133).

Figure 2:
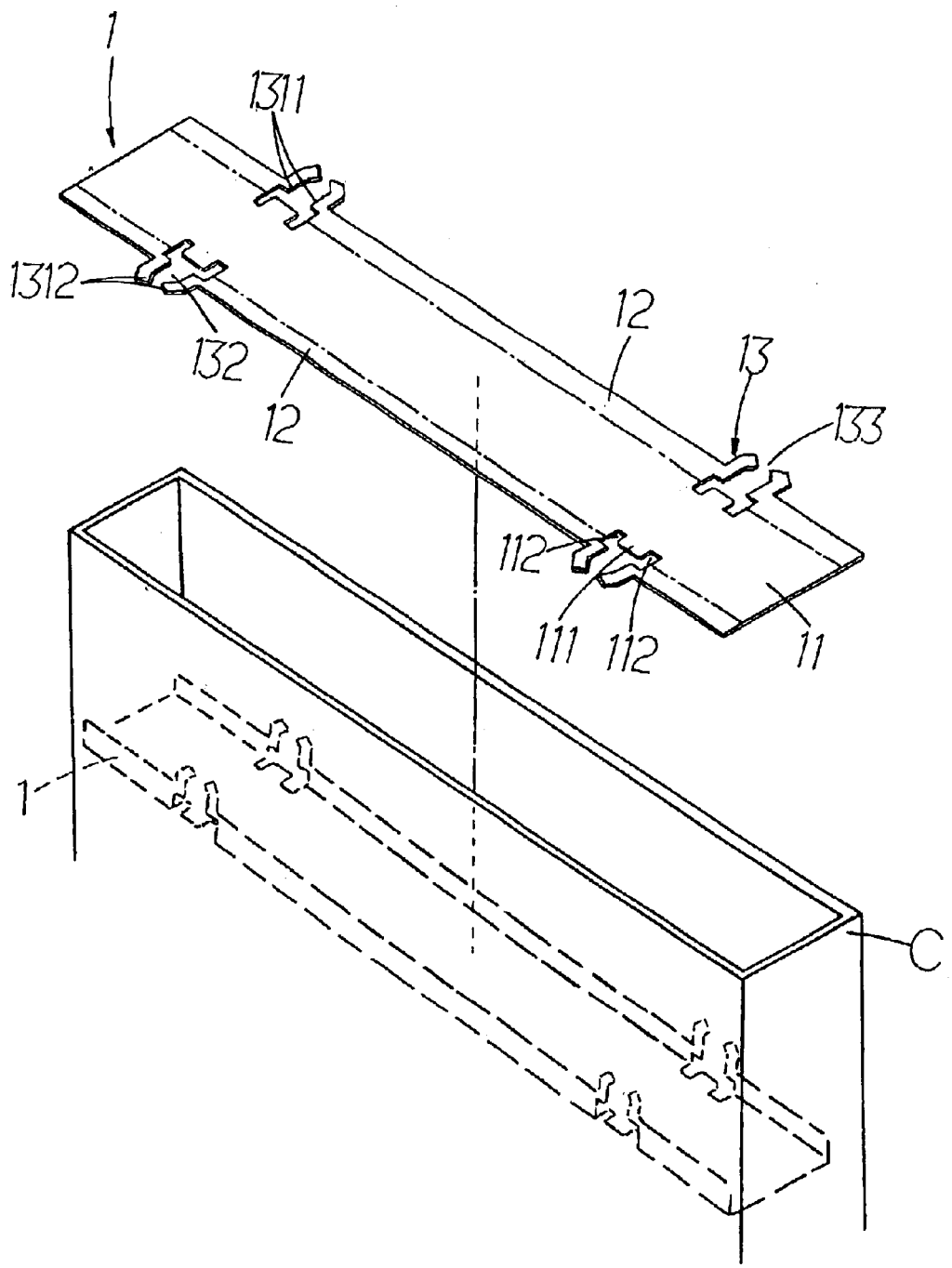
FIG. 2 is a schematic view of an assembly of a fin of the preferred embodiment of the present invention.
Figure 3:
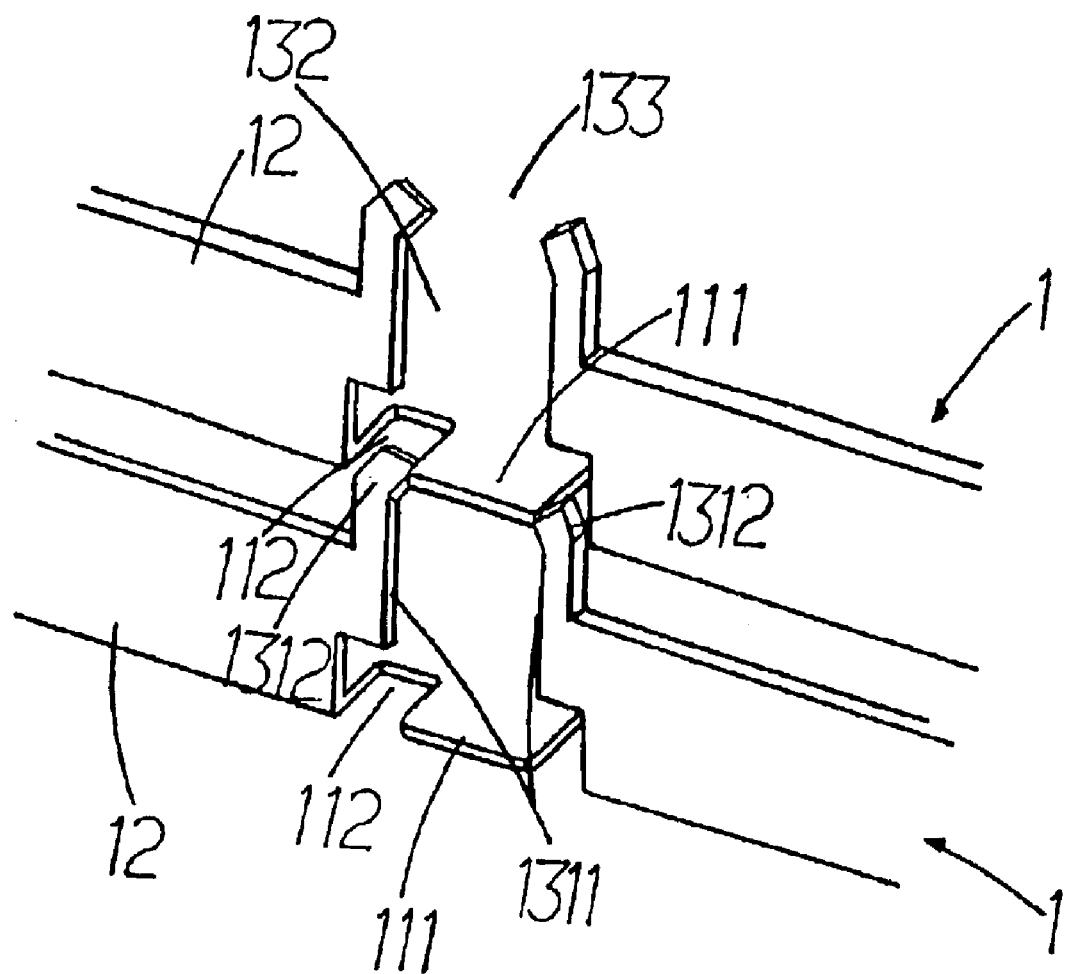
FIG. 3 is a view showing two fins to be engaged to each other in the preferred embodiment of the present invention.
Figure 4:
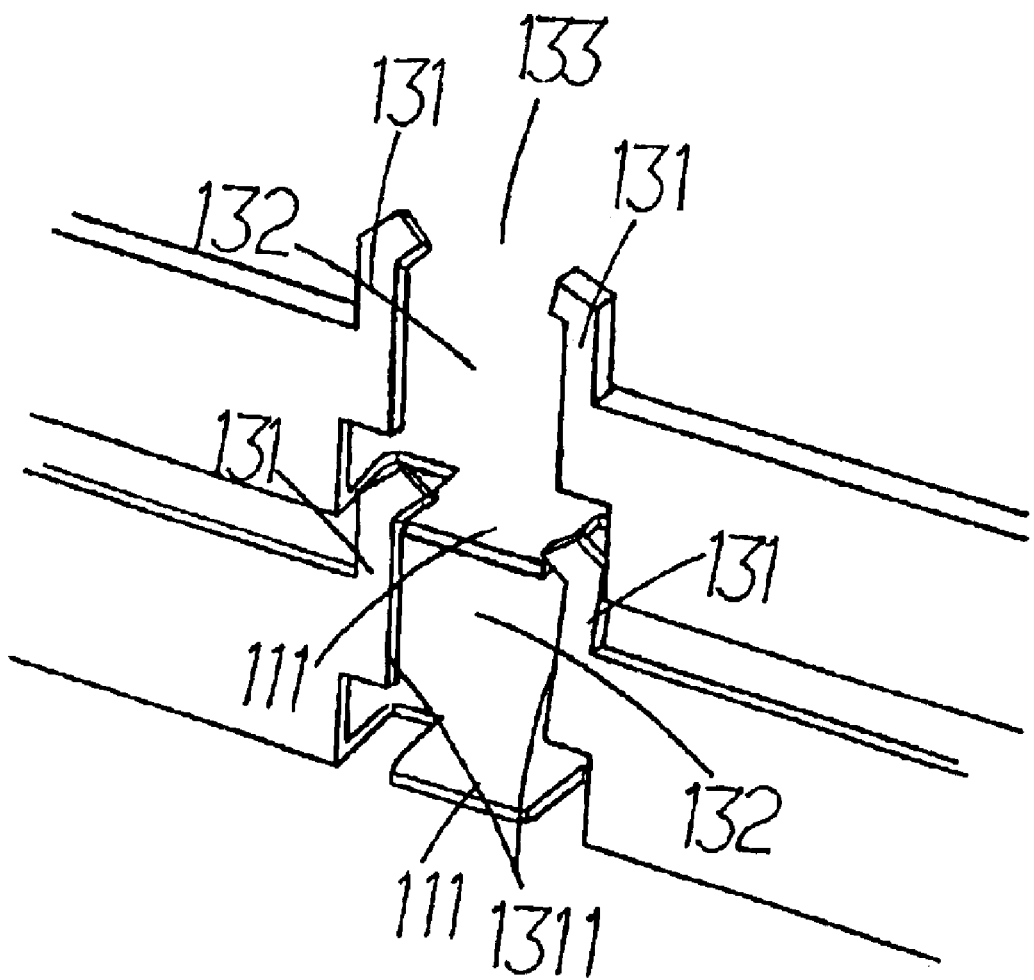
FIG. 4 is another view showing two fins to be engaged to each other in the preferred embodiment of the present invention.
Figure 5:
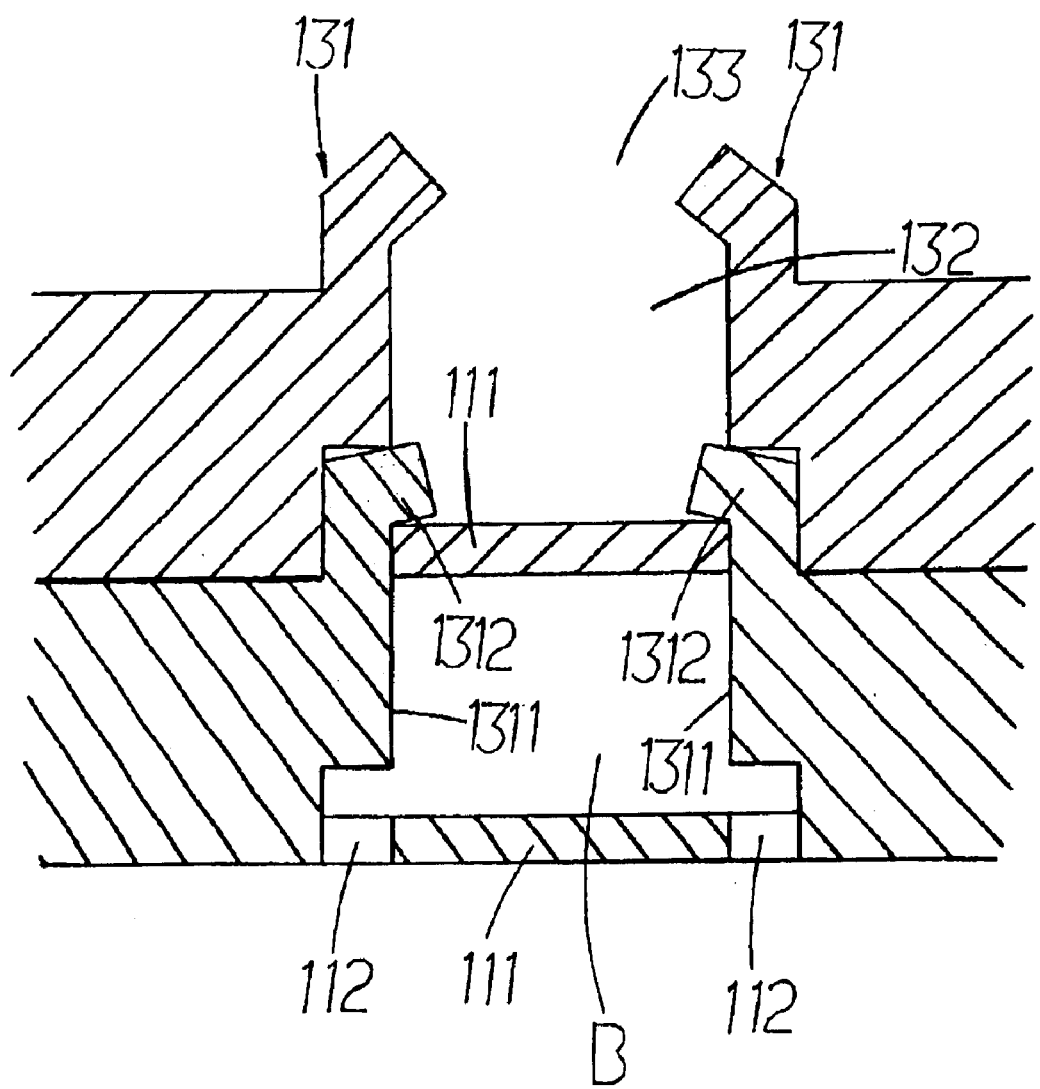
FIG. 5 is a schematic view showing that two fins are engaged to each other in the preferred embodiment of the present invention.

As illustrated in FIG. 2, when both fins (1) are overlapped to each other, both fins (1) are placed in a mold (C) in sequence, wherein; both sidewalls (12) together with all the locking members (13) of each fin (1) are folded up at right angel. Also referring to FIGS. 3, 4, and 5, the latch (111) of the upper fin (1) is locked in the locking gap (132) through the window (133) of the lower fin (1). A jig is used to slightly fold in both of the secondary locking edges (1312) towards the locking gap (132) for both of the secondary locking edges (1312) of both teeth (131) to hold the latch (111) in place. Meanwhile, the elongation from both of the primary locking edges (1311) of both teeth (131) to trap the latch (111) in the locking gap (132) to secure the latch (111) for both of the upper and the lower fins to be tightly incorporated to each other. More fins (1) are overlapped one another in the same locking manner to form the heat sink (A).

Furthermore, the base plate (11) of each fin (1) in the heat sink (A) forms an area for heat dispersion and a specific spacing is defined between any two abutted latches (111, 111') to provide good heat dispersion gap (B) between any two abutted fins (1) in the heat sink (A) to measure sure that the base plate (11) of each fin (1) in the heat sink (A) is able to disperse the heat for the heat sink (A) to prevail its optimal heat dispersion effects, continuously and reliably. The configuration of the present invention differs from the prior art in that the latter has to rely upon insertion boards for all the fins to be inserted into those insertion boards with a pressboard to be placed upon the most top fin. Therefore, the present invention provides the advantages of easier assembly, lower production cost and increased production capacity.

The present invention provides an improved structure for overlapping multiple fins in a hear sink in a firm and steady configuration, wherein any abutted fins to be tightly incorporated to each other by having a latch on a sidewall of the upper fin to be locked in a locking gap with the width of the latch slightly greater than the spacing between two primary locking edges of the locking gap. Therefore, this application for a utility patent is duly filed. However, it should be noted that the preferred embodiment given in the specification is in no way to limit the present invention, and any structure, installation or characteristics that is similar or equivalent to that of the present invention shall be included within the purposes and claims of the present invention.

I claim:

1. A structure for KD heat sink fins comprising:
   a plurality of fins, each of the plurality of fins having:
   a) a base plate having:
      i) a plurality of latches formed on two opposing elongated sides thereof; and
      ii) two recesses, one of the two recesses being located on each of two opposing sides of each of the plurality of latches; and
   b) two side walls, each of the two side walls extending upwardly from one of the two elongated sides of the base plate and having a plurality of locking members, each of the plurality of locking members is aligned with and positioned above one of the plurality of latches and having:
      i) two teeth extending upwardly from one of the two side walls and having inwardly curved ends; and
      ii) a locking gap defined by a distance between a middle portion of the two teeth, the locking gap communicating with two adjacent recesses,
   wherein the plurality of fins are connected together by positioning one of the plurality of latches of a first fin into each of the locking gaps of a second fin.

2. The structure according to claim 1, wherein each of the plurality of latches are retained by the inwardly curved ends of two teeth of one of the plurality of locking members.

3. The structure according to claim 1, wherein each of the plurality of fins is integrally made.

* * * * *